United States Patent
Peters et al.

(10) Patent No.: US 6,828,289 B2
(45) Date of Patent: Dec. 7, 2004

(54) LOW SURFACE TENSION, LOW VISCOSITY, AQUEOUS, ACIDIC COMPOSITIONS CONTAINING FLUORIDE AND ORGANIC, POLAR SOLVENTS FOR REMOVAL OF PHOTORESIST AND ORGANIC AND INORGANIC ETCH RESIDUES AT ROOM TEMPERATURE

(75) Inventors: Darryl W. Peters, Stewartsville, NJ (US); Irl E. Ward, Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/238,851

(22) Filed: Jan. 27, 1999

(65) Prior Publication Data

US 2003/0148910 A1 Aug. 7, 2003

(51) Int. Cl.⁷ .......................... C11D 3/30; C09K 13/00; B08B 3/08
(52) U.S. Cl. ...................................... 510/175; 510/176
(58) Field of Search ................................ 510/175, 176; 252/79.4, 79.1; 438/692, 693, 745, 906, 329; 134/2, 3, 40, 41, 42

(56) References Cited

U.S. PATENT DOCUMENTS

| | | | | |
|---|---|---|---|---|
| 5,320,709 A | | 6/1994 | Bowden et al. ............. 156/667 |
| 5,556,833 A | * | 9/1996 | Howe .......................... 510/189 |
| 5,571,447 A | | 11/1996 | Ward et al. .................. 510/206 |
| 5,676,760 A | | 10/1997 | Aoki et al. .................... 134/1.3 |
| 5,698,503 A | * | 12/1997 | Ward et al. .................. 510/176 |
| 5,792,274 A | * | 8/1998 | Tanabe et al. |
| 5,905,063 A | * | 5/1999 | Tanabe et al. ............... 510/176 |
| 5,968,848 A | * | 10/1999 | Tanabe et al. ............... 428/745 |
| 5,972,862 A | * | 10/1999 | Torii et al. ................... 510/175 |
| 6,117,783 A | * | 9/2000 | Small et al. |
| 2004/0016904 A1 | | 1/2004 | Baum |

OTHER PUBLICATIONS

Merk Index, Eleventh Edition, misc–113.*

Grant & Hackh's Chemical Dictionary, 5th Edition, Roger Grant, Claire Grant.*

* cited by examiner

Primary Examiner—Gregroy Webb
(74) Attorney, Agent, or Firm—R. P. Morris-Oskanian

(57) ABSTRACT

The present invention relates to compositions useful in removing photoresist and organic and inorganic residues and processes for removal of photoresists and etch residues. The compositions are aqueous, acidic compositions containing fluoride and organic polar solvents. The compositions are free of glycols and have a low surface tension and viscosity. Corrosion inhibitors are optionally present.

24 Claims, No Drawings

LOW SURFACE TENSION, LOW VISCOSITY, AQUEOUS, ACIDIC COMPOSITIONS CONTAINING FLUORIDE AND ORGANIC, POLAR SOLVENTS FOR REMOVAL OF PHOTORESIST AND ORGANIC AND INORGANIC ETCH RESIDUES AT ROOM TEMPERATURE

CROSS-REFERENCE TO RELATED APPLICATIONS

[NOT APPLICABLE]

STATEMENT REGARDING FEDERALLY SPONSORED RESEARCH OR DEVELOPMENT

[NOT APPLICABLE]

BACKGROUND OF THE INVENTION

The present invention relates to low surface tension, low viscosity, aqueous, acidic compositions containing fluoride and organic, polar solvents for removal of photoresist and organic and inorganic etch or ash residues and processes for removal of photoresist and etch or ash residues. More particularly, the invention relates to a composition which is buffered having a pH value of between about 3 and about 6 and its use in removing photoresist and etch residue in processes operated at room temperature or above. The compositions of the present invention are free of glycols in general and in particular alkylene glycols and polyoxyalkylene glycols.

In the manufacture of semiconductors and semiconductor microcircuits, it is frequently necessary to coat substrate materials with a polymeric organic substance. Examples of some substrate materials includes, aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light. In subsequent processing steps, this polymeric organic substance (photoresist) must be removed from the surface of the substrate. One common method of removing photoresist from a substrate is by wet chemical means. The wet chemical compositions formulated to remove the photoresist from the substrate must do so without corroding, dissolving, or dulling the surface of any metallic circuitry; chemically altering the inorganic substrate; or attacking the substrate itself. Another method of removing photoresist is by a dry ash method where the photoresist is removed by plasma ashing using either oxygen or forming gas (hydrogen). In many instances the plasma ash method leaves residues or by-products. The residues or by-products may be the photoresist itself or a combination of the photoresist, underlying substrate and etch gasses. These residues or by-products are often referred to as sidewall polymers, veils or fences.

Various compositions for wet chemical removal of photoresists and organic and inorganic etch residues are known in the art. U.S. Pat. No. 5,698,503 discloses a composition for removing photoresist and residue, containing a polyhydric alcohol, ammonium fluoride, an organic polar solvent, water, and an acidic buffering compound, and acetic acid in an amount sufficient to obtain a pH of greater than about 4 and less than 7. The patent discloses propylene glycol and polyoxyalkylene glycols as the polyhydric alcohol and compositions such as, dimethylsulfoxide, dimethyl acetamide, N-methyl pyrrolidone and gamma butyrolactone as the polar solvents. U.S. Pat. No. 5,676,760 discloses processing semiconductor substrates with an electrolyte solution of ammonium chloride, ammonium acetate, ammonium fluoride, ammonium nitrate, ammonium bromide, ammoniun iodide, ammoniumsulphate, ammoniumoxalate, ammoniun carbonate, ammonium citrate, HCl, or ammonia and mixing it with deionized water. U.S. Pat. No. 5,571,447 discloses a composition for removing photoresist and residue containing a polyhydric alcohol, fluoboric acid, a fluoride containing compound and a polar solvent. The pH of the composition is less than 5. The patent discloses propylene glycol and polyoxyalkylene glycols as the polyhydric alcohol, and the polar solvent as preferrably water and/or dimethylsulfoxide. U.S. Pat. No. 5,320,790 discloses a method for selectively removing organometallic residues, native silicon oxides, or damaged silicon oxides created in processing by contacting a substrate with an essentially anhydrous composition of ammonium fluoride salt dissolved in a polyhydric alcohol. The patent discloses only glycols as examples of polyhydric alcohols. Compositions such as those described above exhibit a number of shortcomings. Solvent blends containing DMSO and fluoride (i.e., ammonium fluoride, HF, etc.) pose health risks to users due to the ability of DMSO to transport dissolved materials through the skin. Those solvent compositions containing glycols and a fluoride have a high surface tension (>40 mN/m) and a high viscosity (>40 cps) causing substrate wetting, spray or bulk distribution difficulties. In addition, many of the known compositions containing fluorides do not effectively remove photoresist at room temperature and at elevated temperatures exhibit unacceptably high oxide and metal etch rates. These compositions cannot be used at the contact or via level due to their high oxide etch rate and loss of critical control for patterns. It is the purpose of the present invention to provide compositions that exhibit little human or environmental toxicity; provide greater and more efficient ease of use; minimize corrosion of sensitive metals such as, aluminum, copper, titanium, and the like; and provide photoresist and residue removal at lower temperatures.

BRIEF SUMMARY OF THE INVENTION

The compositions of the present invention are aqueous, buffered solutions with a pH of from about 3 to about 6, containing an organic polar solvent, a fluoride, an acidic buffer solution, and water. Glycols are not present in the compositions of the present invention and DMSO is not a preferred solvent because of the health risks attendant with its use in conjunction with the fluoride containing compositions of the present invention. The compositions of the present invention optionally include a corrosion inhibitor. The compositions of the present invention are used to remove photoresist and/or ash or etch residues formed during the processing of substrates used in the manufacture of semiconductor and microelectronic devices. The method of removal using the compositions of the present invention is carried out by contacting a substrate having photoresist and/or etch or ash residue on its surface with the compositions of the present invention. The actual conditions of the process depend among other things on the type of substrate and the material being removed. A general scheme for removal of a photoresist and/or etch or ash residue would consist of the steps of contacting a substrate with the composition of the present invention at temperatures of at least room temperature; maintaining contact between the substrate and the composition for a predetermined period of time; rinsing with water; and drying with an inert gas.

BRIEF DESCRIPTION OF THE DRAWINGS

[NOT APPLICABLE]

DETAILED DESCRIPTION OF THE INVENTION

The present invention is directed to aqueous, acidic, buffered compositions and methods of removing photoresist and/or etch or ash residue from the surface of a substrate of a semiconductor or microelectric device. The compositions consist essentially of an acidic buffer solution, a polar solvent that is miscible in all proportions in water, a fluoride, and water. The compositions are adjusted to a pH of about 3 to about 6; and optionally includes a corrosion inhibitor and other additives known to those skilled in the art that are typically used in compositions for removing photoresist and/or etch or ash residue.

Glycols and other solvents that would raise the surface tension measured at 25° C. to 40 mN/m or more and increase the viscosity of the composition to 40 cps at 25° C. or more are not included in the composition of the present invention. Dimethylsulfoxide is not a preferred solvent due to the attendant health concerns.

Preferably, the compositions of the present invention consist essentially of; an acidic buffer solution in an amount necessary to obtain a composition pH of from 3 to 6; 30% by weight to 90% by weight of an organic polar solvent that is miscible in all proportions in water; 0.1% by weight to 20% by weight of ammonium fluoride; 0.5% by weight to 40% by weight water; and up to 15% by weight of a corrosion inhibitor.

A pH of between about 3 and about 9 will allow most sensitive metals to passivate with minimum corrosion. Removal of highly inorganic etch residues and oxide skimming however requires a slightly acidic pH. The pH of the compositions of the present invention is adjusted to between about 3 and about 6 for best efficacy for cleaning etch residue and passivation of metals. The pH of the compositions of the present invention are adjusted to a desired pH within a pH range of about 3 to about 6 with acidic buffer solutions. Preferably the pH range is from about 3 to about 6. A preferred buffer contains an ammonium salt of a carboxylic acid or a polybasic acid. An example of such an ammonium salt is an ammonium salt of acetic acid or phosphoric acid. Especially prefered is an aqueous solution of ammonium acetate and acetic acid. Methods of preparing buffer solutions are well known in the art. The acidic buffer solutions, when added to the compositions of the present invention provide a buffered composition with a pH adjusted to minimize corrosion of sensitive metals such as aluminum, copper, titanium, etc. the acidic buffer solution is added in an amount necessary to obtain the desired pH. The addition of the acidic buffer solutions prevents pH swings due to dilution with water or contamination by bases or acids.

The organic polar solvents useful in the present invention are those solvents that are miscible in all proportions in water. Dimethylsulfoxide is not a preferred solvent for purposes of this invention due to attendant health risks. Examples of acceptable organic polar solvents include, dimethylacetamide (DMAC), monoethanolamine, n-methylethanolamine, formamide, n-methyl formamide, gamma-butyrolactone, N-methylpyrrolidone and the like. The use of DMAC is preferred. The inclusion of DMAC results in a composition having a surface tension of <30 mN/m and a viscosity of <10 centipoise. This provides for better substrate wetting, greater ease of rinsability, and facilitates spraying applications and bulk distribution at room temperature. Furthermore, the use of DMAC especially in the presence of water allows the removal of photoresist (including novolak photoresist) at room temperature.

Fluoride is an essential component of the composition of the present invention. Fluoride containing compositions include those of the general formula $R_1, R_2, R_3, R_4 NF$ where $R_1, R_2, R_3$, and $R_4$ are independently hydrogen, an alcohol group, an alkoxy group, an alkyl group or mixtures thereof. Examples of such compositions are ammonium fluoride, tetramethyl ammonium fluoride, tetraethyl ammonium fluoride. Fluoroboric acid can also be used as the fluoride composition. The fluoride is preferably present in amounts of from 0.1% by weight to 20% by weight. Ammonium fluoride is preferred. Ammonium fluoride is available commercially as a 40% aqueous solution.

Water is present as an element of the present invention. It can be present coincidentally as a component of other elements of the invention such as an aqueous ammonium fluoride solution or an aqueous acidic buffer solution, or it can be added separately. Preferably, water is present in amounts of from 0.5% by weight to 40% by weight. The presence of water also improves the solubility of ammonium fluoride in the compositions of the present invention and aids in the removal of photoresist and cleaning of inorganic etch residues.

Corrosion inhibitors in an amount of up to 15% by weight can be added to compositions of the present invention. Preferably, the inhibitor concentration is from about 0.5% by weight to 8% by weight. Any corrosion inhibitor known in the art for similar applications, such as those disclosed in U.S. Pat. No. 5,417,877 which are incorporated herein by reference, may be used. However it has been found that inhibitor compositions with a pKa greater than 6 do not function as well as inhibitor compositions having a pKa of less than about 6 in systems with a pH range of about 3 to about 6. Therefor, preferred inhibitor compositions are those having a pKa of less than about 6. Examples of preferred inhibitor compositions include anthranilic acid, gallic acid, benzoic acid, isophthalic acid, maleic acid, fumaric acid, D,L-malic acid, malonic acid, phthalic acid, maleic anhydride, phthalic anhydride and the like. Examples of corrosion inhibitors that may be used but are not preferred include catechol, pyrogallol, and esters of gallic acid.

The compositions of this invention are especially useful and advantageous for numerous reasons among which may be mentioned the following. The compositions are water soluble, non-corrosive to substrates, non-flammable and of low toxicity. The compositions effectively remove photoresist and etch residues at temperatures as low as 20° C. The compositions are particularity suitable for use with etched via patterns to remove etch residues and photoresist while maintaining critical dimension size. Due to their low surface tension and viscosity, the compositions of the present invention are easily rinsed from substrates and provide for better wetting of the substrates.

The process of the invention is carried out by contacting a substrate having an organic or metal-organic polymer, inorganic salt, oxide, hydroxide, or complex or combination thereof present as a film or residue, with the described composition. The actual conditions, e.g. temperature, time, etc. depend on the nature and the thickness of the material to be removed. In general when it is desired to remove photoresist the substrate is contacted or dipped into a vessel containing the composition at a temperature, preferably between 20° C. and 80° C., more preferably between 20° C.

and 60° C., most preferably between 20° C. and 40° C. for a period of 1 to 15 minutes; rinsed with water; and dried. Drying is typically carried out under an inert atmosphere.

Materials removed with the compositions of the present invention include photoresists known in the art such as novolak and acrylic based resists; and processing residues known in the art by such names as sidewall polymers, veils, fences etch residue, ash residue and the like.

Having described the invention, the following examples are provided to further illustrate and are not intended to limit the present invention.

In the examples below, pH determinations were made using 5% aqueous solutions at ambient temperature and surface tension and viscosity measurements were made at 25° C.

EXAMPLE 1

A composition according to the present was prepared by mixing the following:

| Component | wt % |
| --- | --- |
| acetic acid(glacial) | 12.0 |
| ammonium acetate | 15.2 |
| DMAC | 57.5 |
| ammonium fluoride(40% aq) | 2.5 |
| water(deionized) | 12.4 |

The pH of the composition was 4.75. The surface tension of the composition was 28 mN/m and the viscosity was 10 cps.

EXAMPLE 2

Comparison

A composition according to example 2 in U.S. Pat. No. 5,698,503 was prepared by mixing the following ingredients.

| Component | wt % |
| --- | --- |
| acetic acid(glacial) | 4.0 |
| ammonium acetate | 5.2 |
| propylene glycol | 73.0 |
| DMSO | 12.3 |
| ammonium fluoride(40% aq) | 5.0 |
| catechol | 0.5 |

The pH of the composition was 4.8. The surface tension was 45 mN/M; and the viscosity was 40 cps. The above composition did not remove photoresist at 20° C. or 40° C. The rate of etch of an Al/Cu alloy, titanium, tungsten, a TiN alloy and thermal oxide in a bath containing the above composition was measured at 20° C., 40° C., and 60° C. The immersion bath method of example 3 was used. Metal etch rates were determined using a Veeco FPP-5000 four-point probe system for blanket metal films on thermal oxide. Thermal oxide etch rates were determined using a nanospec AFT optical thickness measurement tool. Etch rates are in Angstroms/minute. Results are given below in Table I.

TABLE I

| (Etch rates in Å/min) | | | | | |
| --- | --- | --- | --- | --- | --- |
| Temperature (° C.) | Al/Cu Alloy | Titanium | Tungsten | TiN Alloy | Thermal Oxide |
| 20 | 9 | 0 | 0 | 0 | 9 |
| 40 | 2 | 4 | 0 | 0 | 46 |
| 60 | 3 | 14 | 0 | 4 | delam. |

EXAMPLE 3

The formulation of example 1 was used to remove ash and etch residue from a substrate with 0.28 micron lines and 0.14 micron spaces at both room temperature(20° C.) and at 40° C. The process involved immersing the substrate samples in a bath containing the composition of example 1; removing the substrate samples from the bath; rinsing with deionized water; and drying under a nitrogen sparge. At room temperature the immersion time was 20 minutes. At 40° C. the immersion time was 10 minutes. The ash and etch residue was removed at both temperatures without reducing the width of the metal lines (Al/Si/Cu alloy). The formulation had an oxide etch rate of ~0.3 angstroms/min. at 20° C. and ~2.0 angstroms/min at 40° C.

EXAMPLE 4

The formulation of example 1 was used to remove novolak photoresist and etch residues from an etched via pattern. The etched via was immersed in a bath equilibrated at 20° C. containing the composition of example 1. Immersion time was 15 minutes. The etched via pattern was subsequently washed with deionized water and dried under nitrogen. The photoresist and etch residue were removed without measurably altering the via size.

EXAMPLE 5

The rate of etch of an Al/Cu alloy, titanium, tungsten, a TiN alloy, and thermal oxide in a bath containing the composition of example 1 was measured at 20° C., 40° C., and 60° C. The immersion bath method of example 3 was used. Metal etch rates were determined with a Veeco FPP-5000 four-point probe system for blanket metal films on thermal oxide.

Thermal oxide etch rates were determined with nanospec AFT optical thickness measurement tool. Etch rates are in Angstroms/minute. Results are given below in Table II.

TABLE II

| (Etch rates in Å/min) | | | | | |
| --- | --- | --- | --- | --- | --- |
| Temperature (° C.) | Al/Cu Alloy | Titanium | Tungsten | TiN Alloy | Thermal Oxide |
| 20 | 2 | <1 | <1 | 0 | 0.3 |
| 40 | 3 | 6 | <1 | 0 | 2 |
| 60 | 3 | 15 | <1 | 0 | 17.5 |

We claim:

1. A low surface tension, low viscosity composition consisting essentially of:
   a. an acidic buffer solution having an acid selected from a carboxylic acid or a polybasic acid and an ammonium salt of the acid in a molar ratio of acid to ammonium salt ranging from 10:1 to 1:10, b. a polar, organic solvent that is miscible in all proportions in water, c. a fluoride, and d. water, where the aqueous composition has a pH of from about 3 to about 6 and is free of glycols.

2. A method of removing photoresist or residue from a substrate, comprising: applying a composition according to claim 1 to the substrate at a temperature of from 20° C. to 80° C. for a period of time sufficient to remove the coating from the substrate.

3. The method as claimed in claim 2, wherein the temperature is from 20° C. to 60° C.

4. The method as claimed in claim 2, where the temperature is from 20° C. to about 40° C.

5. The method as claimed in claim 2, where the temperature is 20° C.

6. The composition of claim 1 further consisting essentially of a corrosion inhibitor.

7. The composition of claim 6 wherein the corrosion inhibitor is at least one selected from anthranilic acid, gallic acid, benzoic acid, malonic acid, maleic acid, fumaric acid, D,L-malic acid, isophthalic acid, phthalic acid, maleic anhydride, phthalic anhydride, catechol, pyrogallol, esters of gallic acid, benzotriazole, and mixtures thereof.

8. The composition of claim 6 wherein the corrosion inhibitor has a pKa of less than about 6.

9. The composition of claim 1 wherein the polar solvent is monoethanolamine, n-methylethanolamine, formamide, n-methylformamide, dimethylacetamide, gamma-butyrolactone, N-methylpyrrolidone or mixtures thereof.

10. The composition of claim 1 wherein the fluoride has a composition of the general formula $R_1, R_2, R_3, R_4NF$, where $R_1, R_2, R_3$ and $R_4$ are independently hydrogen, an alcohol group, an alkoxy group, an alkyl group and mixtures thereof.

11. The composition of claim 10 wherein the fluoride is ammonium fluoride, tetramethyl ammonium fluoride, or tetraethyl ammonium fluoride.

12. The composition of claim 1 wherein the fluoride is fluoroboric acid.

13. The composition of claim 1 wherein the acid within the acidic buffer solution comprises acetic acid and wherein the ammonium salt within the acidic buffer solution comprises ammonium acetate.

14. The composition of claim 1 wherein the acid within the acidic buffer solution comprises phosphoric acid and wherein the ammonium salt within the acidic buffer solution comprises an ammonium salt of phosphoric acid.

15. The composition of claim 1 having a surface tension less than or equal to 30 mN/m and a viscosity of less than or equal to 15 centipoise at 25° C.

16. A low surface tension, low viscosity composition consisting essentially of:

a. an acidic buffer solution having acetic acid and ammonium acetate in a molar ratio of acetic acid to ammonium acetate ranging from 10:1 to 1:10, b. from 30% by weight to 90% by weight of an organic polar solvent that is miscible in all proportion in water, c. from 0.1% by weight to 20% by weight of a fluoride, and d. from 0.5% by weight to 40% by weight of water, and e. optionally up to 15% by weight of a corrosion inhibitor, wherein a pH of the composition ranges from about 3 to about 6 and the composition is free of glycols.

17. The composition of claim 16 wherein the molar ratio is substantially 1:1.

18. The composition of claim 16 wherein the fluoride comprises ammonium fluoride.

19. The composition of claim 16 wherein the surface tension is less than or equal to 30 mN/m.

20. The composition of claim 16 wherein the viscosity is less than or equal to 15 centipoise at 25° C.

21. A glycol-free composition for cleaning a semiconductor substrate, the composition consisting essentially of:

a. an acidic buffer solution having an acid selected from a carboxylic acid and a polybasic acid and an ammonium salt of the acid in a molar ratio of acid to ammonium salt ranging from 10:1 to 1:10 and wherein the acidic buffer solution is present in an amount sufficient to maintain a pH of the composition from about 3 to about 6, b. from 30% by weight to 90% by weight of an organic polar solvent that is miscible in all proportion in water, c. from 0.1% by weight to 20% by weight of fluoride, d. from 0.5% by weight to 40% by weight of water, and e. optionally up to 15% by weight of a corrosion inhibitor.

22. The composition of claim 21 wherein the acid is acetic acid.

23. The composition of claim 21 wherein the ammonium salt is ammonium acetate.

24. The composition of claim 21 wherein the molar ratio is substantially 1:1.

* * * * *